United States Patent
Lee et al.

(10) Patent No.: US 9,287,327 B2
(45) Date of Patent: Mar. 15, 2016

(54) IMAGE SENSOR, METHOD FOR MANUFACTURING THE SAME, AND IMAGE PROCESSING DEVICE HAVING THE IMAGE SENSOR

(71) Applicant: SAMSUNG ELECTRONICS CO., LTD., Suwon-si, Gyeonggi-do (KR)

(72) Inventors: Myung Won Lee, Hwaseong-si (KR); Sang Chul Sul, Suwon-si (KR); Hirosige Goto, Suwon-si (KR); Sae Young Kim, Yongin-si (KR); Gwi Deok Ryan Lee, Suwon-si (KR); Masaru Ishii, Hwaseong-si (KR); Kyo Jin Choo, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/310,305

(22) Filed: Jun. 20, 2014

(65) Prior Publication Data

US 2014/0375826 A1    Dec. 25, 2014

(30) Foreign Application Priority Data

Jun. 21, 2013 (KR) .......................... 10-2013-0071589

(51) Int. Cl.
*H04N 5/225* (2006.01)
*H01L 27/30* (2006.01)
*H04N 9/04* (2006.01)

(52) U.S. Cl.
CPC .............. *H01L 27/307* (2013.01); *H04N 9/045* (2013.01)

(58) Field of Classification Search
CPC .................................................. H01L 27/14621
USPC ......................................... 348/207.1; 257/40
See application file for complete search history.

(56) References Cited

U.S. PATENT DOCUMENTS

| | | | |
|---|---|---|---|
| 7,663,685 B2 | 2/2010 | Inuiya | |
| 7,667,750 B2 | 2/2010 | Goto et al. | |
| 7,919,350 B2 | 4/2011 | Cho et al. | |
| 8,054,355 B2 * | 11/2011 | McCarten et al. | 348/294 |
| 8,988,778 B2 * | 3/2015 | Kang et al. | 359/491.01 |
| 2011/0220778 A1 | 9/2011 | Inaba | |
| 2011/0272772 A1 | 11/2011 | Kokubun | |

FOREIGN PATENT DOCUMENTS

| | | |
|---|---|---|
| JP | 2006-120773 | 5/2006 |
| JP | 2006-140249 | 6/2006 |

* cited by examiner

*Primary Examiner* — Joel Fosselman
(74) *Attorney, Agent, or Firm* — F. Chau & Associates, LLC

(57) ABSTRACT

An image sensor comprising: a first layer having a plurality of groups of photodiodes formed in a semiconductor substrate, each group representing a 2×2 array of photodiodes, with 2 first pixels configured to detect light of a first wavelength and 2 second pixels configured to detect light of a second wavelength, each first pixel positioned adjacent to the second pixels; and a second layer overlapping the first layer, the second layer is organic, having a plurality of organic photodiodes configured to detect light of a third wavelength, each organic photodiode positioned to partially overlap 2 first photodiodes and 2 second photodiodes of the first layer.

20 Claims, 14 Drawing Sheets

US 9,287,327 B2

IMAGE SENSOR, METHOD FOR MANUFACTURING THE SAME, AND IMAGE PROCESSING DEVICE HAVING THE IMAGE SENSOR

CROSS-REFERENCE TO RELATED APPLICATIONS

This application claims the benefit of Korean Patent Application No. 10-2013-0071589, filed on Jun. 21, 2013, in the Korean Intellectual Property Office, the disclosure of which is incorporated by reference herein.

TECHNICAL FIELD

Embodiments of the present inventive concept relate to an image sensor, and more particularly to an image sensor for generating a high-resolution image in which a pixel is in effect decreased in size without a decrease in the physical size of the pixel, a method for manufacturing the same, and an image processing device having the image sensor.

DISCUSSION OF RELATED ART

To increase the resolution of a CMOS image sensor of a given size, the number of pixels included in an active pixel array need to be increased and the physical size of each pixel need to be decreased, so that more pixels can fit in a given light receiving area.

As the pixel decreases in size, a photo-electronic conversion element, e.g., a photo diode, included in the pixel also decreases in size, and it may be difficult to embody circuitry for reading an output signal of the photo-electronic conversion element.

SUMMARY

According to an embodiment of the present inventive concept, an image sensor is provided, comprising: a first layer having a plurality of groups of photodiodes formed in a semiconductor substrate, each group representing a 2×2 array of photodiodes, with 2 first photodiodes configured to detect light of a first wavelength and 2 second photodiodes configured to detect light of a second wavelength, each first photodiode positioned adjacent to the second photodiodes; and a second layer overlapping the first layer, the second layer is organic, having a plurality of organic photodiodes configured to detect light of a third wavelength, each organic photodiode positioned to partially overlap 2 first photodiodes and 2 second photodiodes of the first layer. According to an embodiment, the area of overlap of each of the partially overlapped first photodiodes and second photodiodes is substantially the same.

According to an embodiment of the present inventive concept, the image sensor further includes a circuit part configured to read the detected light from the first and second photodiodes of the first layer, the circuit part positioned relative to the semiconductor substrate for front side illumination, wherein the circuit part is positioned between the first layer and the second layer. The image sensor further including a color filter positioned between the first layer and the second layer.

According to an embodiment of the present inventive concept, the image sensor may further include a circuit part configured to read the detected light of the first layer, the circuit part positioned relative to the semiconductor substrate for back side illumination.

According to an embodiment of the present inventive concept, the image sensor may further include a floating diffusion region formed adjacent to each photo diode on the semiconductor substrate, each floating diffusion region is shared by an organic photo diode.

The image sensor may further include a first readout circuit configured to read the light detected by each photo diode on the semiconductor substrate and a second readout circuit configured to read the light detected by each organic photo diode.

According to an embodiment of the present inventive concept, an image sensor is provided, comprising: a first layer having a plurality of first photodiodes and a plurality of second photodiodes formed on a semiconductor substrate, the first photodiodes configured to detect light of a first wavelength and the second photodiodes configured to detect light of a second wavelength, wherein the first photodiodes and the second photodiodes are alternately positioned with each of the first photodiodes positioned adjacent to a second photodiode and visa versa; and a second layer overlapping the first layer, the second layer is organic, having a plurality of organic photodiodes configured to detect light of a third wavelength, wherein the organic photodiodes are skewed with respect to alignment with the first photodiodes and the second photodiodes when viewed perpendicularly to the semiconductor substrate, wherein the light of the third wavelength is green.

According to an embodiment of the present inventive concept, a plurality of storage regions is formed in the semiconductor substrate, each of the storage region corresponding to a photodiode configured to store electrical charges transmitted through a corresponding metallic contact.

According to an embodiment of the present inventive concept, the skew in alignment between the organic photodiodes and the first and second photo pixels is about 50% in width and length of a photodiode.

The image sensor may further include a circuit part configured to read the detected light of the first layer, the circuit part positioned relative to the semiconductor substrate for front side illumination, and may further include a color filter positioned between the first layer and the second layer.

According to an embodiment of the present inventive concept, the image sensor may include a circuit part configured to read the detected light of the first layer, the circuit part positioned relative to the semiconductor substrate for back side illumination.

According to an embodiment of the present inventive concept, the number of photodiodes on the semiconductor substrate is the same as the number of organic photodiodes on the second layer.

According to an embodiment of the present inventive concept, a method of forming an image sensor is provided, comprising: forming a first layer having a plurality of first photodiodes and a plurality of second photodiodes on a semiconductor substrate, the first photodiodes configured to detect light of a first wavelength and the second photodiodes configured to detect light of a second wavelength including positioning the first photodiodes and the second photodiodes alternately with each of the first photodiodes positioned adjacent to a second photodiode and visa versa; and forming a second layer overlapping the first layer, the second layer is organic, having a plurality of organic photodiodes configured to detect light of a third wavelength, wherein the organic photodiodes are skewed with respect to alignment with the first photodiodes and the second photodiodes when viewed perpendicularly to the semiconductor substrate.

The method may further include positioning the semiconductor substrate in between a circuit part configured to read the detected light of the first layer and the second layer.

The method may include forming color filters over the semiconductor substrate; and forming photo-electric conversion regions of the organic material on pixel electrodes. According to an embodiment of the present inventive concept, a method of processing image detection data comprising each pixel having four overlapped sections, each section having overlapped one pixel on the first layer and one pixel on the second layer, with data detected represented by G=GS/4; B=B1S/4; and R=avg(R2S/4+R1S/4). According to an embodiment of the present inventive concept, a portable electronic device is provided, comprising: an image processing device; an optical lens; a digital signal processor; a display; and an image sensor, comprising a first layer having a plurality of first photodiodes and a plurality of second photodiodes formed on a semiconductor substrate, the first photodiodes configured to detect light of a first wavelength and the second photodiodes configured to detect light of a second wavelength, wherein the first photodiodes and the second photodiodes are alternately positioned with each of the first photodiodes positioned adjacent to a second photodiode and visa versa; and a second layer overlapping the first layer, the second layer is organic, having a plurality of organic photodiodes configured to detect light of a third wavelength, wherein the organic photodiodes are skewed with respect to alignment with the first photodiodes and the second photodiodes when viewed perpendicularly to the semiconductor substrate.

The portable electronic device may further include a wireless transceiver configured to transmit and receive signals wirelessly.

The portable electronic device may further include a memory, wherein the memory is a DRAM or a NAND flash memory.

According to an embodiment of the present inventive concept, the portable electronic device may be embodied in one of a digital camera, a camcorder, a mobile phone, a smart phone, or a tablet personal computer (PC).

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EMBODIMENTS

Figure 1:
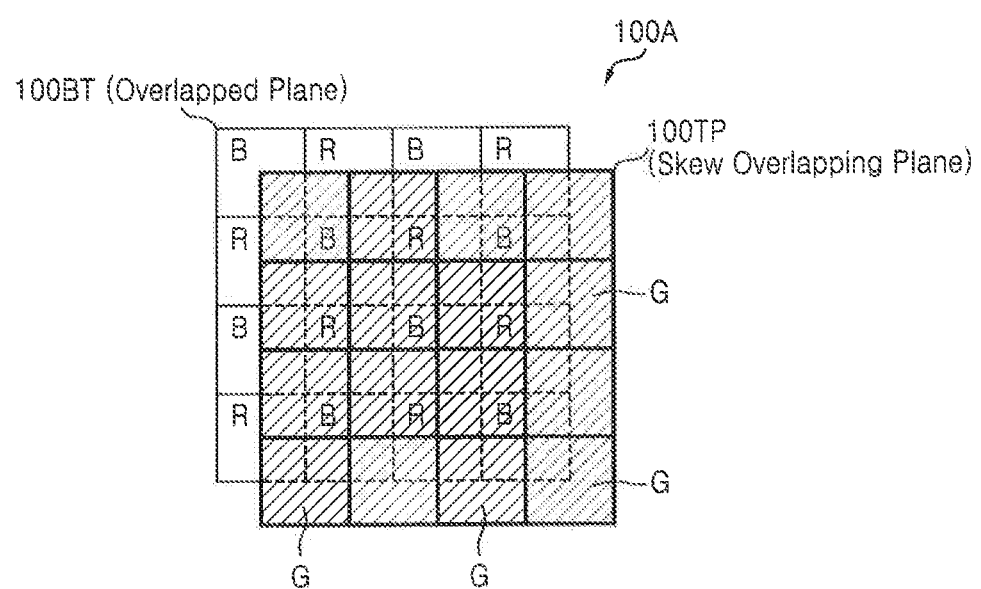
FIG. 1 shows a structure of an image sensor according to an example embodiment of the present inventive concept.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 shows a structure of an image sensor according to an example embodiment of the present inventive concept;

Referring to FIG. 1, an image sensor 100A, which may be referred to as a pixel array, includes a first layer 100BT including a plurality of blue B and red R pixels, and a second layer 100TP including a plurality of green pixels G.

The second layer 100TP and the first layer 100BT are partially overlapped with each other. The first layer 100BT may be referred to as an overlapped plane, and the second layer 100TP may be referred to as an overlapping plane. As shown, the overlapping of the first and second layer is not a direct overlap; rather, the overlapping is skewed so that each green pixel G overlaps a portion of two blue pixels B and two red pixels R.

Each of the plurality of green pixels G is partially overlapped with each of n*n pixels among a plurality of B and R pixels, wherein n is a natural number greater than 1. For purposes of illustration, n is 2 in the present embodiment.

'R' indicates a red pixel which may generate an electrical signal corresponding to red wavelengths (or red color range). 'B' indicates a blue pixel which may generate an electrical signal corresponding to blue wavelengths (or blue color range). 'G' indicates a green pixel which may generate an electrical signal corresponding to green wavelengths (or green color range).

Figure 2:
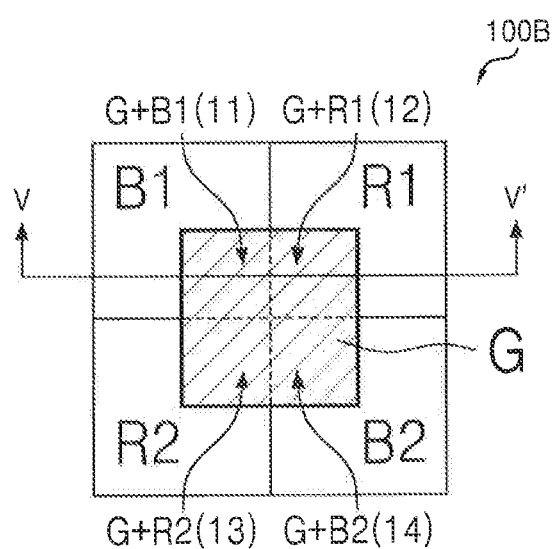
FIGS. 2 to 4 depict embodiments of an image sensor including a green pixel disposed to overlap other pixels.
Figure 3:
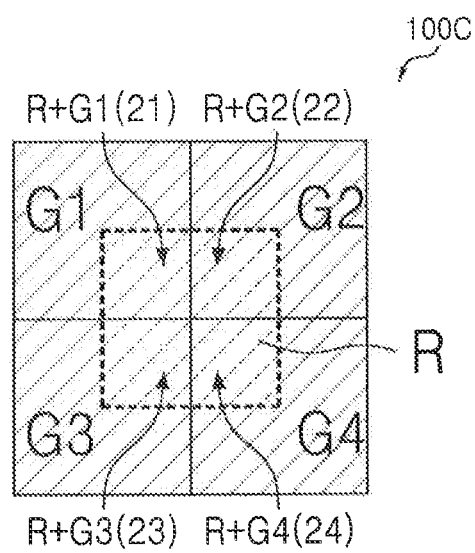
Figure 4:
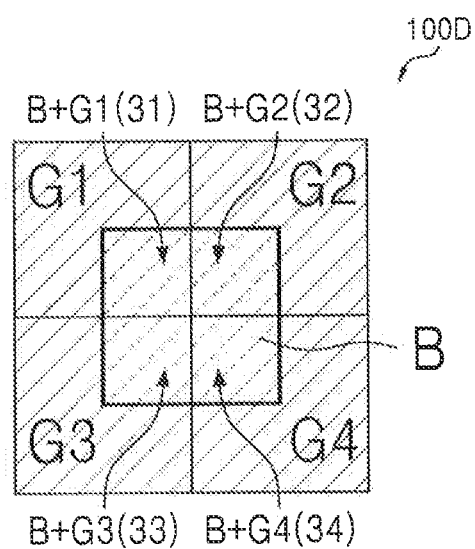

FIGS. 2 to 4 depict structures of an image sensor including a green pixel disposed so as to be partially overlapped with each of the n*n pixels.

Referring to FIGS. 1 and 2, an image sensor 100B corresponding to a portion of the image sensor 100A includes 2*2 pixels B1, R1, R2, and B2 disposed in the first layer 100BT, and a green pixel G arranged in the second layer 100TP.

The plurality of pixels B and R arranged in the first layer 100BT of FIG. 1 include 2*2 pixels with alternating B and R pixels, for example, B1, R1, R2 and B2. Each of the 2*2 pixels B1, R1, R2, and B2 may be partially overlapped with the green pixel G. Each of overlapping regions 11, 12, 13, and 14 of the green pixel G partially overlapped with each of the 2*2 pixels B1, R1, R2, and B2.

The sum of the partially overlapped overlapping regions 11, 12, 13, and 14 is equal to the size of the green pixel G, with each overlapped portion in B1, R1, R2, and B2 having substantially the same size. As shown in FIGS. 1 and 2, the skew in the alignment of the green pixel G with respect to the pixels B and R is about 50% in width and length of an overlapped pixel, when viewed perpendicularly to the first layer or the second layer. In other embodiments, the amount of skew of the green pixel G layer with the B and R pixel layer may vary to not overlap precisely equally over the B and R pixels.

In a section (or region) 11 where two pixels G+B1 are overlapped, a signal corresponding to green wavelengths (or a green region of visible light) and a signal corresponding to blue wavelengths (or a blue region of visible light) are generated.

In a section (or region) 12 where two pixels G+R1 are overlapped with each other, a signal corresponding to green wavelengths and a signal corresponding to red wavelengths (or a red region of visible light) are generated.

In a section (or region) 13 where two pixels G+R2 are overlapped with each other, a signal corresponding to green wavelengths and a signal corresponding to red wavelengths are generated.

In a section (or region) 14 where two pixels G+B2 are overlapped, a signal corresponding to green wavelengths and a signal corresponding to blue wavelengths are generated.

Referring to FIGS. 1 and 3, an image sensor 100C corresponding to a portion of the image sensor 100A includes a red pixel R disposed in the first layer 100BT and 2*2 green pixels G1, G2, G3, and G4 disposed in the second layer 100TP.

A plurality of green pixels arranged on the second layer 100TP of FIG. 1 include 2*2 green pixels G1, G2, G3, and G4.

A portion of the plurality of green pixels of FIG. 1 may be expressed as the 2*2 green pixels G1, G2, G3, and G4. Each of the 2*2 green pixels G1, G2, G3, and G4 and a red pixel R is partially overlapped with each other.

In a section 21 where two pixels R+G1 are overlapped with each other, a signal corresponding to red wavelengths and a signal corresponding to green wavelengths are generated.

In a section 22 where two pixels R+G2 are overlapped with each other, a signal corresponding to red wavelengths and a signal corresponding to green wavelengths are generated.

In a section 23 where two pixels R+G3 are overlapped with each other, a signal corresponding to red wavelengths and a signal corresponding to green wavelengths are generated.

In a section 24 where two pixels R+G4 are overlapped with each other, a signal corresponding to red wavelengths and a signal corresponding to green wavelengths are generated.

Referring to FIGS. 1 and 4, an image sensor 100D corresponding to a portion of the image sensor 100A includes a blue pixel B disposed on the first layer 100BT and 2*2 green pixels G1, G2, G3, and G4 disposed on the second layer 100TP.

A plurality of green pixels arranged on the second layer 100TP of FIG. 1 include 2*2 green pixels G1, G2, G3, and G4.

A portion of the plurality of green pixels G of FIG. 1 may be expressed as the 2*2 green pixels G1, G2, G3, and G4. Each of the 2*2 green pixels G1, G2, G3, and G4 and the blue pixel B are partially overlapped with each other.

Each overlapping region 31, 32, 33, and 34 of the 2*2 green pixels G1, G2, G3, and G4 are partially overlapped with the blue pixel B.

In a section 31 where two pixels B+G1 are overlapped with each other, a signal corresponding to blue wavelengths and a signal corresponding to green wavelengths are generated.

In a section 32 where two pixels B+G2 are overlapped with each other, a signal corresponding to blue wavelengths and a signal corresponding to green wavelengths are generated.

In a section 33 where two pixels B+G3 are overlapped with each other, a signal corresponding to blue wavelengths and a signal corresponding to green wavelengths are generated.

In a section 34 where two pixels B+G4 are overlapped with each other, a signal corresponding to blue wavelengths and a signal corresponding to green wavelengths are generated.

The 2*2 pixels as shown and described with reference to FIGS. 1 to 4 are duplicated throughout the first layer 100BT.

Figure 5:
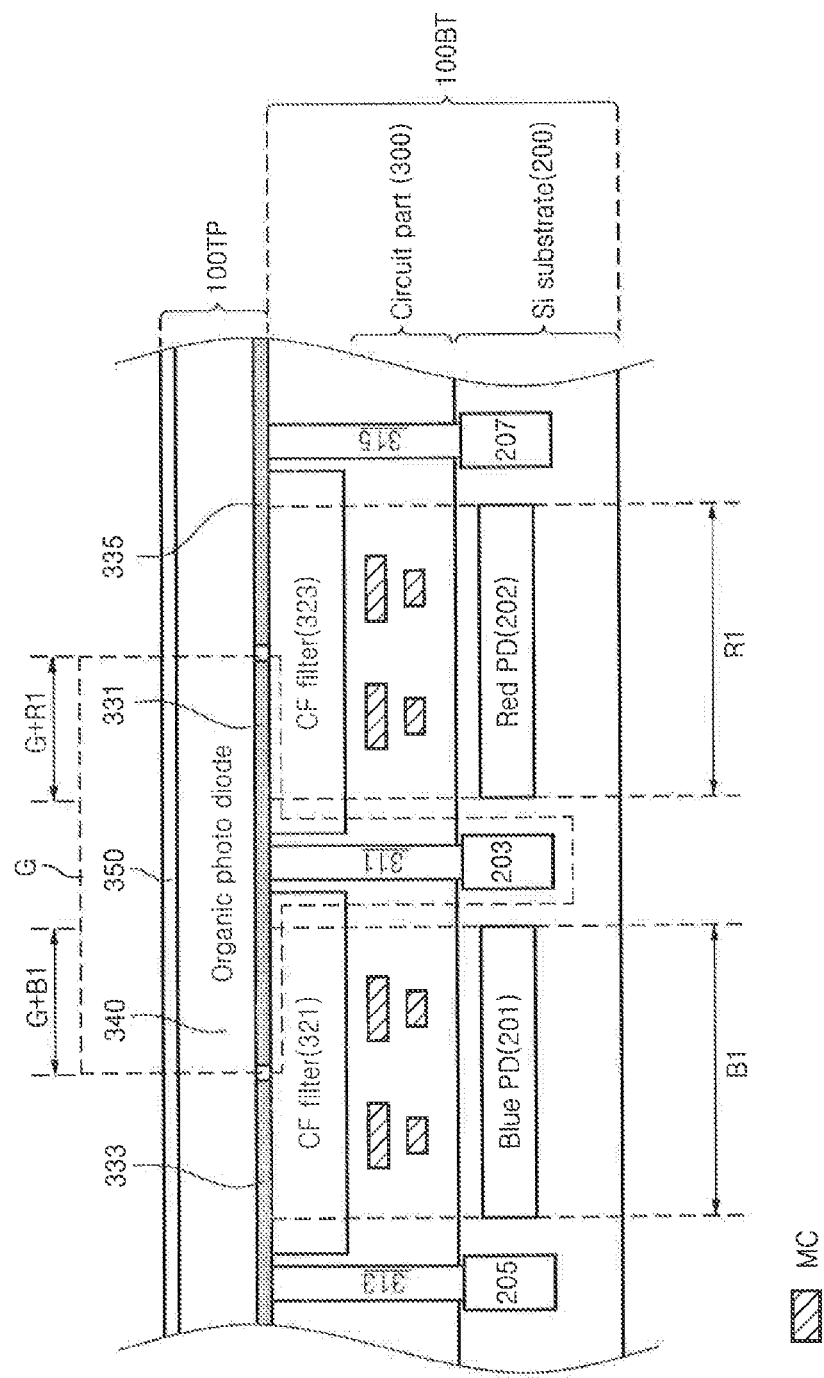
FIG. 5 is a cross-sectional view of the image sensor of FIG. 2 taken along line V-V', embodied in a frontside illumination (FSI) manner.

FIG. 5 is an embodiment of an image sensor embodied in a frontside illumination (FSI) manner, shown in a cross-sectional view of the image sensor of FIG. 2 taken along line V-V'. Referring to FIGS. 1, 2, and 5, a blue photo-electric conversion region 201, a red photo-electric conversion region 202, and a plurality of green storage regions 203, 205, and 207 are formed in a semiconductor substrate 200, which may be a silicon substrate.

Each of the plurality of green storage regions 203, 205, and 207 accumulates or stores electrical charges transmitted through each metallic contact 311, 313, and 315.

A circuit part 300 may be formed on or over the semiconductor substrate 200.

Circuitry disposed in the circuit part 300 includes transistors for transmitting charges accumulated in each region 201, 202, 203, 205, and 207 to respective floating diffusion regions FD. The circuit part 300 also includes metal interconnects MC connecting each region 201, 202, 203, 205, and 207 to a readout circuit.

Color filters 321 and 323 may be formed on or over the circuit part 300.

A blue color filter 321 allows blue wavelengths which have passed through pixel electrodes 331 and 333 to pass through the blue photo-electric conversion region 201.

The blue photo-electric conversion region 201 performs a photo-electric conversion operation based on the blue wavelengths. Pixel electrodes 331 and 333, which are separated from each other, are formed on the blue color filter 321.

For convenience of description in FIG. 5, it is illustrated that the length where a blue color filter 321 and a pixel electrode 331 are overlapped with each other is the same as the length where the blue color filter 321 and the pixel electrode 333 are overlapped with each other; however, according to other embodiments, the amount of overlap between the G pixels with the B and R pixels can vary and may not be the same, depending on the variation in the skew between the layers 100BT and 100TP.

Portions of electrodes 331 and 333 cover corresponding color filter 321, and portions of electrodes 331 and 335 cover corresponding color filter 323.

A red color filter 323 allows red wavelengths which have passed through the pixel electrodes 331 and 335 to pass through the red photo-electric conversion region 202. The red photo-electric conversion region 202 performs a photo-electric conversion operation based on the red wavelengths.

The pixel electrodes 331 and 335 separated from each other are formed on the red color filter 323.

For convenience of description in FIG. 5, it is illustrated that the length where a red color filter 323 and a pixel electrode 331 are overlapped with each other is the same as the length where the red color filter 323 and the pixel electrode 335 are overlapped with each other, however, according to other embodiments, the amount of overlap between the G pixels with the B and R pixels can vary and may not be the same, depending on the variation in the skew between the layers 100BT and 100TP.

The pixel electrodes 331, 333, and 335 that are formed on color filters 321 and 323 are separated from each other.

On each pixel electrode 331, 333, and 335, a photo-electric conversion region 340 is formed. The photo-electric conversion region 340 is made of an organic material. The photo-electric conversion region 340 performs a photo-electric conversion operation based on green wavelengths, generates electrical charges, and allows blue wavelengths and red wavelengths to pass through.

The photo-electric conversion region 340 may include an electron donating organic material and/or an electron accepting organic material. For example, a first organic layer may be formed on each pixel electrode 331, 333, and 335, and a second organic layer may be formed on the first organic layer.

When the first organic layer includes an electron donating organic material, the second organic layer may be formed to include an electron accepting organic material, or visa versa. For example, when the first organic layer is embodied from one of a p-type organic material and a n-type organic material, e.g., a n-type organic material, the second organic layer may be embodied from the other of the p-type organic material and the n-type organic material, e.g., the p-type organic material.

Accordingly, the first organic layer and the second organic layer may form a hetero p-n junction. Here, the electron donating organic material is a material which may generate a donor ion in response to light, and the electron accepting organic material is a material which may generate an acceptor ion in response to the light.

According to another example embodiment, the photo-electronic conversion region 340 of an organic material may be embodied from an organic material which is a compound (or mixed) of the electron donating organic material and the electron accepting organic material.

Each pixel electrode 331, 333, and 335 collects electrical charges generated based on green wavelengths in the photo-electric conversion region 340 of an organic material and allows blue wavelengths and red wavelengths to pass through.

Each pixel electrode 331, 333, and 335 may be embodied in a transparent electrode. For example, each pixel electrode 331, 333, and 335 may be embodied in zinc oxide (ZnO) or Indium tin oxide or tin-doped indium oxide (ITO). Each pixel electrode 331, 333, and 335 may be embodied in a pixel electrode film.

Electrical charges collected by each pixel electrode 331, 333, and 335 are transmitted to each green storage region 203, 205, and 207 through each wiring or each contact plug 311, 313, and 315.

A common electrode 350 is formed on the photo-electric conversion region 340 of an organic material. The common electrode 350 supplies a bias voltage to the photo-electric conversion region 340 of an organic material.

The common electrode 350 may be embodied in a transparent electrode, ZnO, or ITO. The common electrode 350 may be embodied in a pixel electrode film.

The green pixel G includes the pixel electrode 331, the photo-electric conversion region of an organic material 340, and the common electrode 350. The green pixel G may be defined by the pixel electrode 331.

Figure 6:
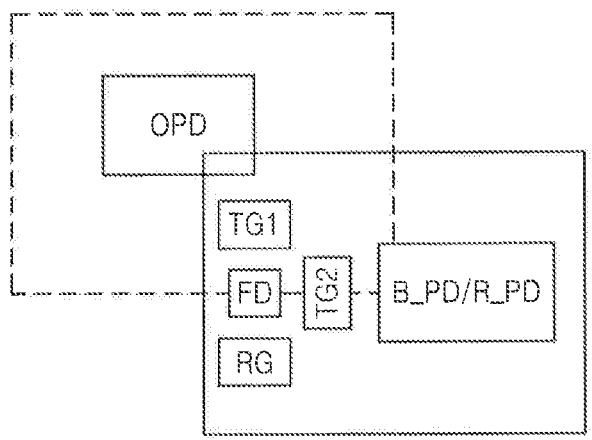
FIG. 6 is a top view of a green pixel partially overlapped with a red pixel or a blue pixel, according to an embodiment of the present inventive concept.

FIG. 6 is a top view of a green pixel and a red pixel which are partially overlapped with each other, or a top view of a green pixel and a blue pixel which are partially overlapped with each other. In FIG. 6, OPD denotes the photo-electric conversion region 340 of an organic material or a photo diode of an organic material, B_PD denotes a blue photo-electric conversion region 201 or a photodiode related to (or defined by) the blue photo-electric conversion region 201, and R_PD denotes a red photo-electric conversion region 202 or a photo diode related to (or defined by) the red photo-electric conversion region 202.

FD denotes a floating diffusion region, and TG1, TG2, TG3, and TG4 each denote a transfer transistor or a gate electrode of a transfer gate. RG denotes a reset transistor or a gate electrode of a reset gate.

For example, a green pixel including OPD and a blue pixel including B_PD may share the floating diffusion region FD. Moreover, the green pixel including OPD and a red pixel including R_PD may share a floating diffusion region FD. The floating diffusion region FD may be embodied in the semiconductor substrate 200, and TG1, TG2, TG3, and TG4 may be embodied in the circuit part 300.

Figure 7:
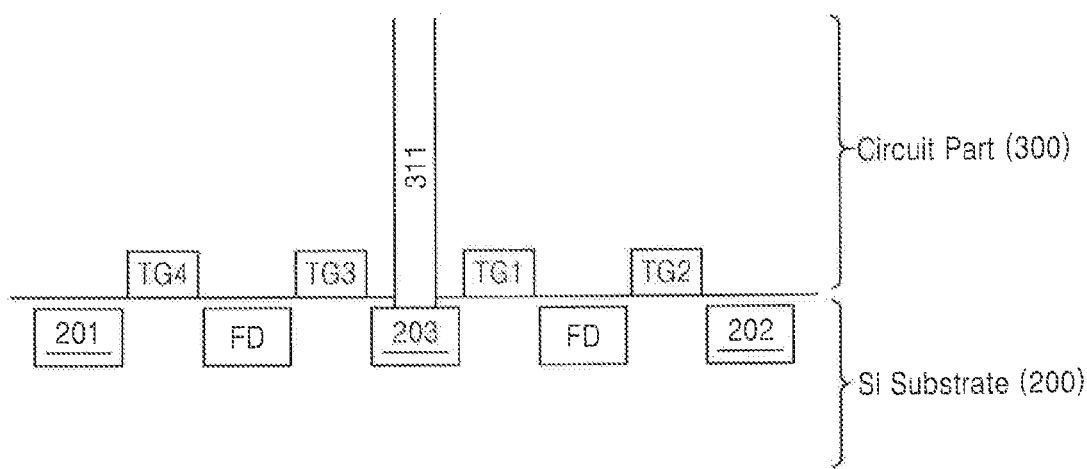
FIG. 7 shows a semiconductor substrate and a circuit part of the image sensor shown in FIG. 5.

FIG. 7 is a diagram of the semiconductor substrate and the circuit part 300 of FIG. 5. As illustrated in FIG. 7, each floating diffusion region corresponding to each region 201, 202, 203, 205, and 207 may be formed in the semiconductor substrate 200.

Figure 8:
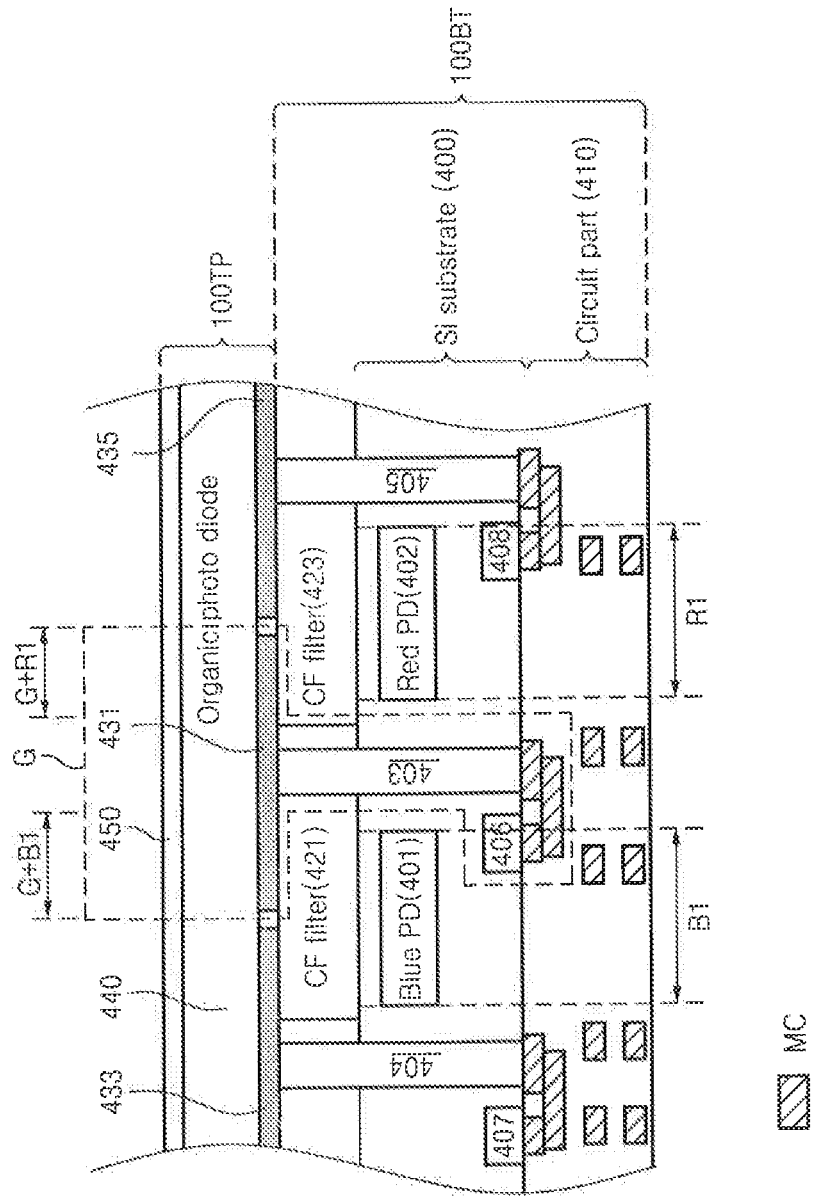
FIG. 8 is a cross-sectional view of the image sensor of FIG. 2, taken along line V-V', embodied in a backside illumination (BSI) manner.

FIG. 8 shows a cross-sectional view of an image sensor embodied in a backside illumination (BSI) manner according to an embodiment of the present inventive concept.

Referring to FIGS. 1, 2, and 8, a blue photo-electric conversion region 401, a red photo-electric conversion region 402, a plurality of green storage regions 406, 407, and 408 are formed in the semiconductor substrate 400.

Each of the plurality of green storage regions 406, 407, and 408 accumulates or stores electrical charges transmitted through each metal or each contact plug 403, 404, and 405.

Each floating diffusion region corresponding to each region 401, 402, 406, 407, and 408 may be formed in the semiconductor substrate 400.

A circuit part 410 may be formed under the semiconductor substrate 400. A gate electrode of each transmission transistor may be embodied in the circuit part 410. The transmission transistor transmits charges accumulated in each region 401, 402, 406, 407, and 408 to each floating diffusion region. Metal interconnectors MC are embodied in the circuit part 410 to transmit the charges accumulated in each region 401, 402, 406, 407, and 408 to a readout circuit.

Color filters 421 and 423 may be formed on or over the semiconductor substrate 400. The color filters 421 and 423 are embodied at an opposite side of the circuit part 410 based on the semiconductor substrate 400.

A blue color filter 421 allows blue wavelengths which have passed through pixel electrodes 431 and 433 to pass through the blue photo-electric conversion region 401. The blue photo-electric conversion region 401 performs a photo-electric conversion operation based on the blue wavelengths. The pixel electrodes 431 and 433 which are separated from each other are formed on the blue color filter 421.

For convenience of description in FIG. 8, it is illustrated that the length where the blue color filter 421 and the pixel electrode 431 are overlapped with each other is essentially the same length where the blue color filter 421 and the pixel electrode 433 are overlapped with each other; however, the length of overlapping may not be the same in other example embodiments.

A red color filter 423 allows red wavelengths which have passed through pixel electrodes 431 and 435 to pass through a red photo-electric conversion region 402. The red photo-electric conversion region 402 performs a photo-electric conversion operation based on the red wavelengths. The pixel electrodes 431 and 435 which are separated from each other are formed on the red color filter 423.

For convenience of description in FIG. 8, it is illustrated that the length where the red color filter 423 and the pixel electrode 431 are overlapped with each other is essentially the same length where the red color filter 423 and the pixel electrode 435 are overlapped with each other; however, the length of overlapping may not be the same in other example embodiments.

Each pixel electrode 431, 433, and 435 is separated from each other. The pixel electrodes may be formed on color filters 421 and 423. The photo-electric conversion region 440 of an organic material may be formed on each pixel electrode 431, 433, and 435.

Each pixel electrode 431, 433, and 435 collects electrical charges generated based on green wavelengths in the photo-electric conversion region 440 of an organic material, and allows blue wavelengths and red wavelengths to pass through. Each pixel electrode 431, 433, and 435 may be embodied in a transparent electrode such as ZnO or ITO. Each pixel electrode 431, 433, and 435 may be embodied in a pixel electrode film.

Electrical charges collected by each pixel electrode 431, 433, and 435 are transmitted to each green storage region 406, 407, and 408 through each wiring or each contact plug 403, 404, and 405.

A common electrode 450 is formed on the photo-electric conversion region 440 of an organic material. The common electrode 450 supplies a bias voltage to the photo-electric conversion region 440 of an organic material. The common electrode 450 may be embodied in a transparent electrode such as ZnO or ITO. The common electrode 450 may be embodied in a pixel electrode film.

A green pixel G includes the pixel electrode 431, the photo-electric conversion region 440 of an organic material, and the common electrode 450. The green pixel G is defined by the pixel electrode 431.

A configuration of components as illustrated in FIGS. 6 and 7 and described in connection therewith is applicable to an image sensor of FIG. 8.

Figure 9:
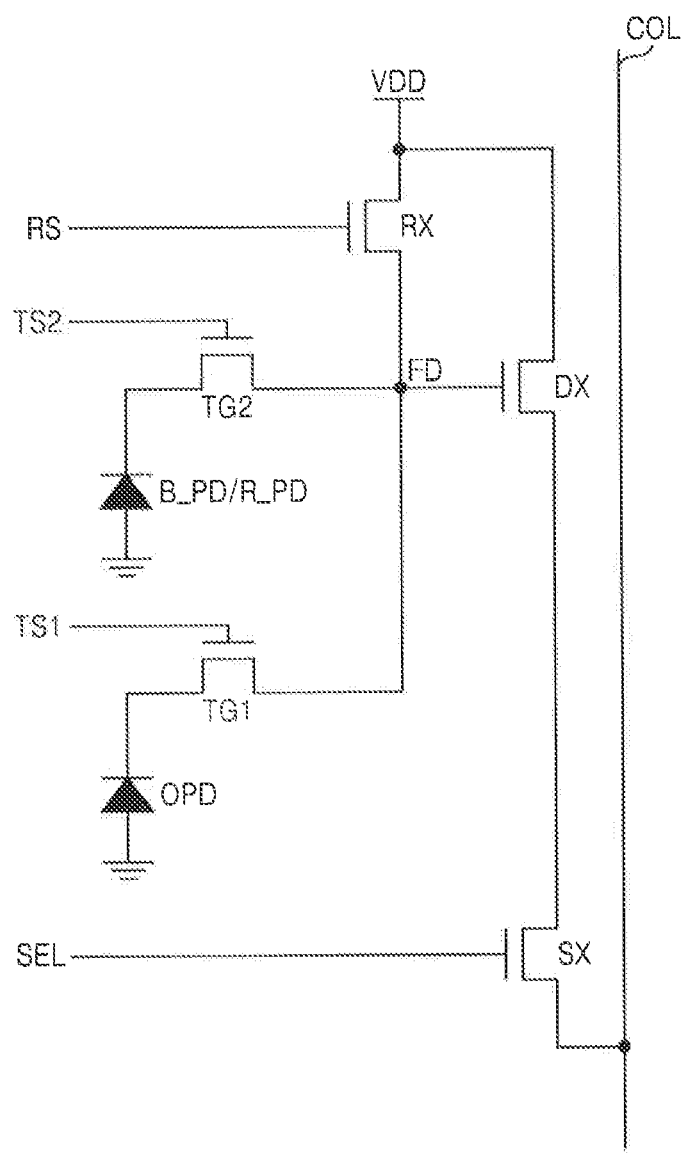
FIG. 9 is an example embodiment of a readout circuit including a green pixel and a red pixel.

FIG. 9 is an example embodiment of a readout circuit including a green pixel and a red pixel. Referring to FIGS. 5 to 9, OPD and R_PD share one floating diffusion region FD. Moreover, in another example embodiment, OPD and B_PD share one floating diffusion region FD. The floating diffusion region FD may be referred to as a floating diffusion node.

From a pixel viewpoint, a green pixel and a red pixel share one floating diffusion region FD.

A readout circuit includes two transmission transistors TG1 and TG2, the floating diffusion region FD, a reset transistor RX, a drive transistor DX, and a selection transistor SX.

A first transmission transistor TG1 operates in response to a first transmission control signal TS1, a second transmission transistor TG2 operates in response to a second transmission control signal TS2, the reset transistor RX operates in response to a reset control signal RS, and the selection transistor SX operates in response to a selection signal SEL.

When activation time of the first transmission control signal TS1 and activation time of the second transmission control signal TS2 are adequately controlled, a signal corresponding to electrical charges generated by OPD and a signal corresponding to electrical charges generated by R_PD may be transmitted to a column line COL according to an operation of each transistor DX and SX. Here, OPD, R_PD, or B_PD may be embodied in a photo transistor, a photo gate, a pinned photo diode (PPD), or a combination of these.

Figure 10:
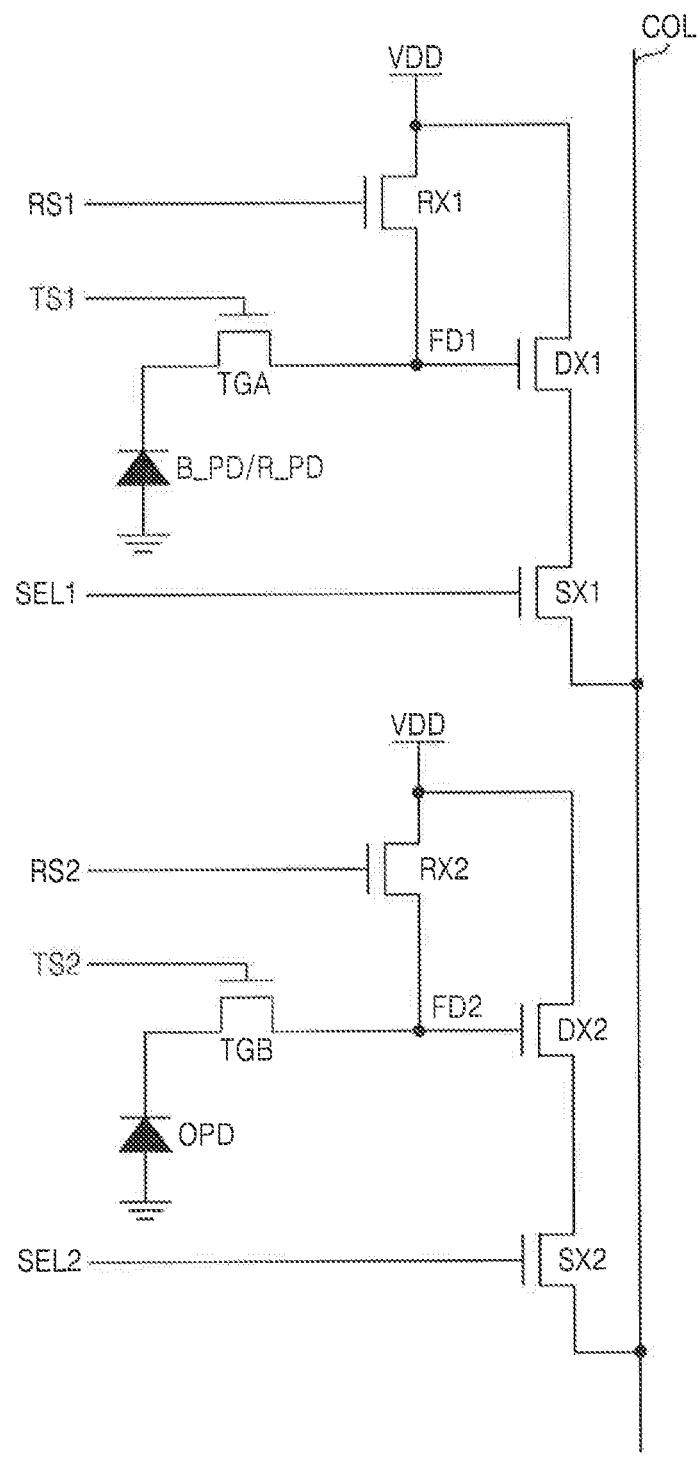
FIG. 10 is an example embodiment of the readout circuit including a green pixel and a red pixel.

FIG. 10 is another example embodiment of a readout circuit including a green pixel and a red pixel.

Referring to FIGS. 5, 8, and 10, a first readout circuit which reads electrical charges generated by R_PD (or B_PD) and a second readout circuit which reads electrical charges generated by OPD are separated from each other. From a pixel viewpoint, a green pixel and a red pixel are separated from each other. The first readout circuit includes a first transmission transistor TGA, a first floating diffusion region FD1, a first reset transistor RX1, a first drive transistor DX1, and a first selection transistor SX1.

The first transmission transistor TGA operates in response to a first transmission control signal TS1, the first reset transistor RX1 operates in response to a first reset control signal RS1, and the first selection transistor SX1 operates in response to a first selection signal SEL1.

The second readout circuit includes a second transmission transistor TGB, a second floating diffusion region FD2, a second reset transistor RX2, a second drive transistor DX2, and a second selection transistor SX2.

The second transmission transistor TGB operates in response to a second transmission control signal TS2, the second reset transistor RX2 operates in response to a second reset control signal RS2, and the second selection transistor SX2 operates in response to a second selection signal SEL2.

When activation time of the first transmission control signal TS1 and activation time of the second transmission control signal TS2 are adequately controlled, a signal corresponding to electrical charges generated by OPD and a signal corresponding to electrical charges generated by R_PD may be transmitted to a column line COL according to an operation of each transistor DX1 and SX1, and DX2 and SX2.

Figure 11:
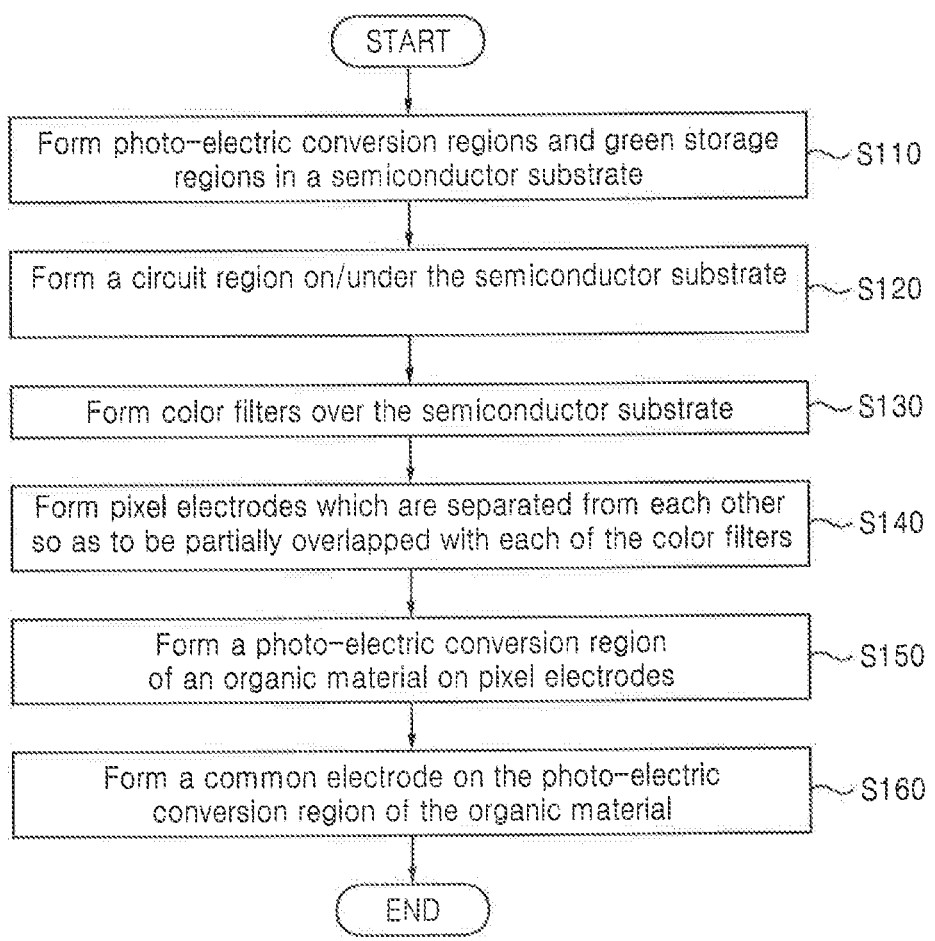
FIG. 11 is a flow diagram of a method of manufacturing an image sensor according to an example embodiment of the present inventive concept.

FIG. 11 is a flowchart describing a method for manufacturing an image sensor according to an example embodiment of the present inventive concept.

A method for manufacturing an image sensor in an FSI manner according to an example embodiment of the present inventive concepts will be described referring to FIGS. 1 to 7, and 11.

The blue photo-electric conversion region 201, the red photo-electric conversion region 202, and a plurality of green storage regions 203, 205, and 207 are formed in the semiconductor substrate 200 (S110).

The circuit part 300 is formed on or above the semiconductor substrate 200(S120).

Color filters 321 and 323 are formed on the circuit part 300 (S130).

Pixel electrodes 331, 333, and 335 which are separated from each other are formed to partially overlap with each of the color filters 321 and 323(S140).

The photo-electric conversion region 340, made of an organic material, is formed on each pixel electrode 331, 333, and 335 (S150). The common electrode 350 is formed on the photo-electric conversion region 340 of an organic material (S160).

A method for manufacturing an image sensor in a BSI manner according to an example embodiment of the present inventive concepts will be described referring to FIGS. 1 to 4, 6, 7, 8, and 11.

A blue photo-electric conversion region 401, a red photoelectric conversion region 402, and a plurality of green storage regions 406, 407, and 408 are formed in the semiconductor substrate 400 (S110).

The circuit part 410 is formed under the semiconductor substrate 400 (S120).

The color filters 421 and 423 are formed on the semiconductor substrate 400 at the opposite side of the circuit part 410 (S130).

Pixel electrodes 431, 433, and 435 are formed, which are separated from each other, to partially overlap with each of the color filter 421 and 423 (S140).

The photo-electric conversion region 440 of an organic material is formed on each pixel electrode 431, 433, and 435 (S150).

The common electrode 450 is formed on the photo-electric conversion region 440 of an organic material (S160).

Figure 12:
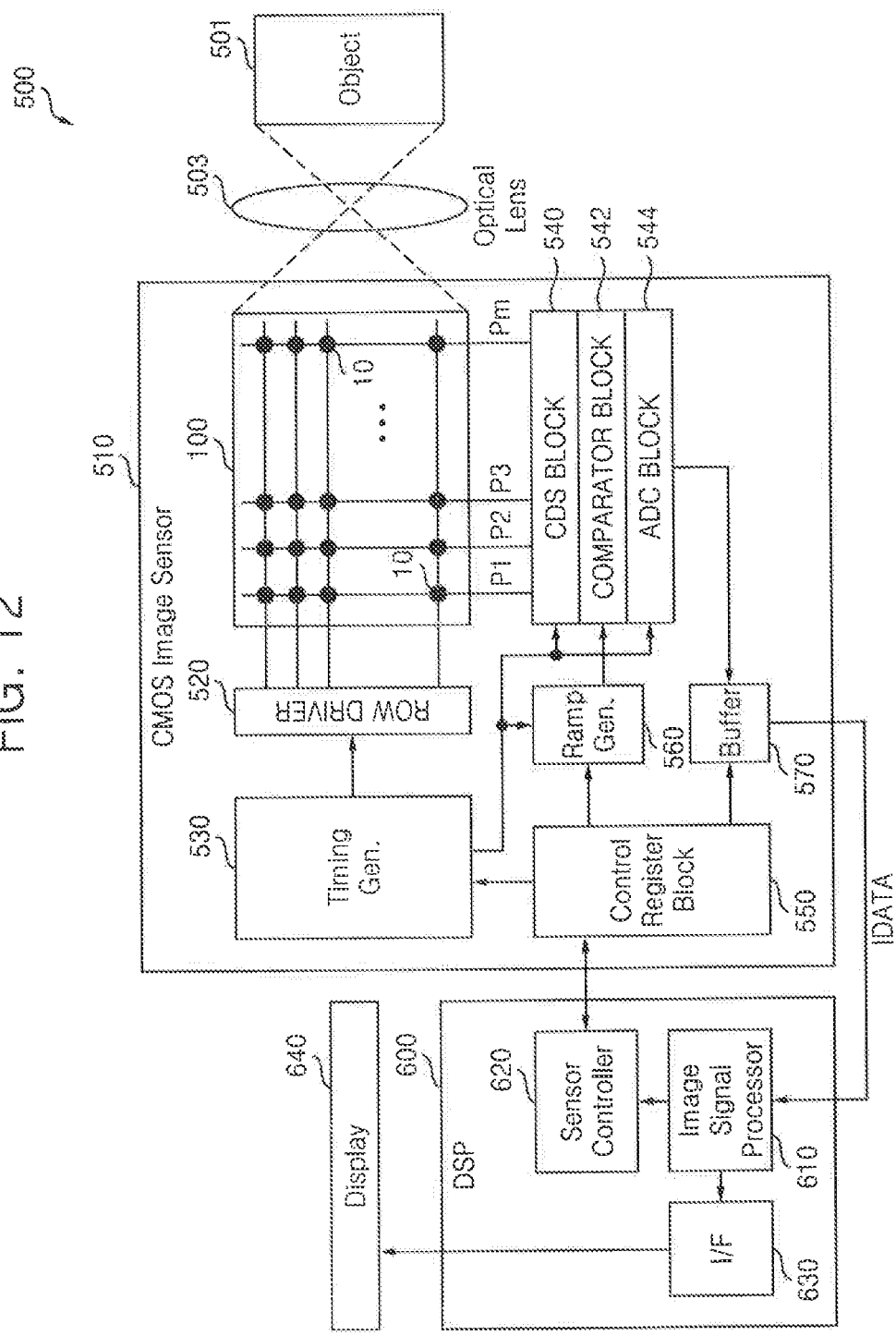
FIG. 12 is a block view of an image processing device including an image sensor according to an embodiment of the present inventive concept.

FIG. 12 is a block diagram of an image processing device including an image sensor according to at least one of the above described embodiments.

Referring to FIGS. 1 and 12, an image processing device 500 may be embodied in a portable electronic device, e.g., a digital camera, a camcorder, a mobile phone, a smart phone, or a tablet personal computer (PC).

The image processing device 500 includes an optical lens 503, a digital signal processor 600, a display 640, and an image sensor 510 according to at least one of the above described embodiments.

According to an example embodiment, the image processing device 500 may or may not include the optical lens 503.

The CMOS image sensor 510 generates image data IDATA for an object 501 incident through the optical lens 503.

The CMOS image sensor 510 includes a pixel array 100, a row driver 520, a timing generator 530, a correlated double sampling (CDS) block 540, a comparison block 542, and an analog-to-digital conversion (ADC) block 544, a control register block 550, a ramp signal generator 560, and a buffer 570.

The pixel array 100 collectively includes the image sensor 100A, 100B, 100C, and 100D described referring to FIGS. 1 to 4.

The pixel array 100 includes pixels 10 arranged in a matrix form. As described referring to FIGS. 1 to 11, the pixel array 100 includes a first layer 100BT having a plurality of pixels R and B, and a second layer 100TP having a plurality of green pixels G.

The row driver 520 drives control signals (at least two of TS1, TS2, RS, RS1, RS2, SEL, SEL1, and/or SEL2) for controlling an operation of each of the pixels 10 to the pixel array 100 according to a control of the timing generator 530.

The timing generator 530 controls an operation of the row driver 520, the CDS block 540, the ADC block 542, and the ramp signal generator 560.

The CDS block 540 performs correlated double sampling on a pixel signal P1 to Pm, where m is a natural number, output from each of the plurality of column lines embodied in the pixel array 100.

The comparison block 542 compares each of the plurality of correlated double sampled pixel signals output from the CDS block 540 with a ramp signal output from the ramp signal generator 560, and outputs a plurality of comparison signals.

The ADC block 544 converts each of the comparison signals output from the comparison block 542 into a digital signal, and outputs a plurality of digital signals to the buffer 570.

The control register block 550 controls an operation of the timing generator 530, the ramp signal generator 560, and the buffer 570 according to a control of a digital signal processor 600. The buffer 570 transmits image data IDATA corresponding to the plurality of digital signals output from the ADC block 544 to the digital signal processor 600.

The digital signal processor 600 includes an image signal processor 610, a sensor controller 620, and an interface 630. The image signal processor 610 controls a sensor controller 620 controlling the control register block 550, and an interface 630.

According to an example embodiment, the CMOS image sensor 510 and the digital signal processor 600 may be embodied in one package, e.g., a multi-chip package. According to another example embodiment, the CMOS image sensor 510 and the image signal processor 610 may be embodied in one package, e.g., a multi-chip package.

The image signal processor 610 processes image data IDATA transmitted from the buffer 570, and transmits the processed image data to the interface 630. The sensor controller 620 generates various control signals for controlling the control register block 550 according to a control of the image signal processor 610.

The interface 630 transmits image data processed by the image signal processor 610 to the display 640. The display 640 displays image data output from the interface 630.

The display 640 may be embodied in thin film transistor-liquid crystal display (TFT-LCD), a light emitting diode (LED) display, an organic LED (OLED) display, an active-matrix OLED (AMOLED) display, or a flexible display.

Figure 13:
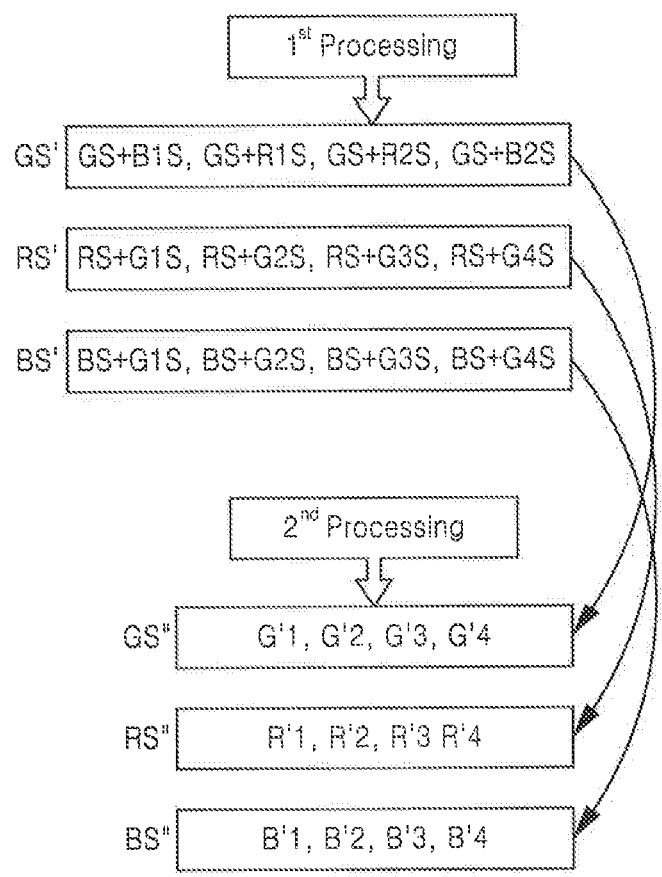
FIG. 13 is a flow diagram showing of an signal processing operation of image signals from an image sensor according to an embodiment of the present inventive concept.

FIG. 13 is a flowchart describing an exemplary operation of an image signal processor in processing and interpolating the image signals received from the image sensor. According to an exemplary embodiment of the present inventive concept and referring to FIGS. 1 to 13, the image signal processor 610 performs processing twice. As an example, processing of the overlapping region 11 may yield G'=GS/4, B'=B1S/4, R'=avg (R2S/4+R1S/4), wherein G' represents ¼ of the entire G pixel, B' is of the blue pixel B1 and R' is the combination and average of the ¼ regions of R1 and R2.

A method for acquiring a green signal GS' and GS" is described referring to FIGS. 2, 12, and 13. A green image signal output from each overlapping region 11, 12, 13, and 14 may be different from each other due to variations in a process, a voltage, and temperature (PVT); however, for convenience of description, it is assumed that a green image signal GS output from each overlapping region 11, 12, 13, and 14 is the same as each other.

A first processing for output signals of each overlapping region 11, 12, 13, and 14 may be performed simultaneously or at different times. The first processing means generation of a blue signal and a red signal from the first layer and generation of a green signal from the second layer.

The second processing of the overlapping region 11 may yield G'=GS/4, B'=BIS/4, R'=avg(R2S/4+R1S/4).

The second processing, e.g., interpolation, on output signals of each overlapping region 11, 12, 13, and 14 may utilize known interpolation processes such as for Bayer, Panchromatic or EXR filters. According to exemplary embodiments of the present inventive concept, a modified bilinear interpolation process is utilized; further, such processing can be performed simultaneously or at different times for the red, green, and blue signals.

Figure 14:
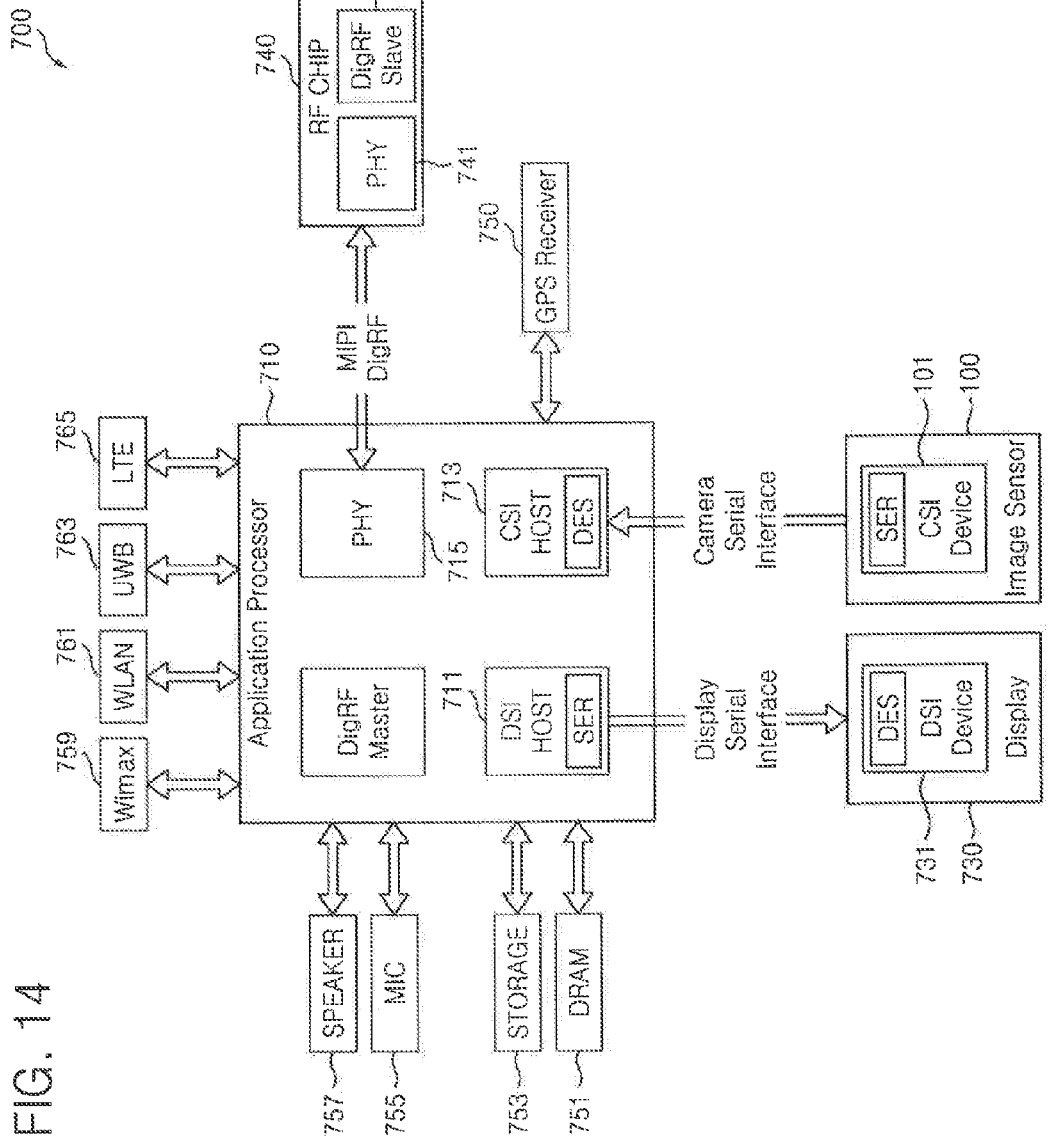
FIG. 14 is a block view of a portable electronic device including an image processing device and an image sensor according to an embodiment of the present inventive concept.

FIG. 14 is a block diagram of portable electronic device including an image processing device and an image sensor according to the above described embodiments.

Referring to FIGS. 1 and 14, the image processing device 200 may be embodied in a portable electronic device which may use or support a mobile industry processor interface (MIPI®) or high speed serial interface.

The portable electronic device may be embodied in a laptop computer, a personal digital assistant (PDA), a portable media player (PMP), a mobile phone, a smart phone, a tablet personal computer (PD), or a digital camera.

The image processing device 700 includes an application processor (AP) 710, an image sensor 120, and a display 730. A camera serial interface (CSI) host 713 embodied in an AP 710 may perform a serial communication with a CSI device 101 of the image sensor 100 through a camera serial interface (CSI).

According to an example embodiment, a de-serializer (DES) may be embodied in the CSI host 713, and a serializer (SER) may be embodied in the CSI device 101. The image sensor 100 may denote the image sensor 100A described referring to FIGS. 1 to 6.

A display serial interface (DSI) host 711 embodied in the AP 710 may perform a serial communication with a DSI device 731 of the display 730 through a display serial interface. According to an example embodiment, a serializer (SER) may be embodied in the DSI host 711, and a deserializer (DES) may be embodied in the DSI device 731. Each of the deserializer (DES) and a serializer (SER) may process an electrical signal or an optical signal.

The image processing device 700 may further include a radio frequency (RF) chip 740 which may communicate with the AP 710. A physical layer (PHY) 715 of the AP 710 may transmit or receive data to/from a PHY 741 of a RF chip 740 according to MIPI DigRF.

The image processing device 700 may further include a GPS receiver 750, a memory 751 like a dynamic random access memory (DRAM), a data storage device 753 embodied in a non-volatile memory like a NAND flash memory, a mike 755, or a speaker 757.

The image processing device 700 may communicate with an external device using at least one communication protocol or communication standard, e.g., worldwide interoperability for microwave access (WiMAX) 759, Wireless LAN (WLAN) 761, ultra-wideband (UWB) 763, or long term evolution (LTE™) 765. The image processing device 700 may communicate with an external device using a Bluetooth or WiFi.

While the inventive concept has been particularly shown and described with reference to exemplary embodiments thereof, it will be understood that various changes in form and details may be made therein without departing from the spirit and scope of the following claims.

What is claimed is:

1. An image sensor, comprising:
a first layer having a plurality of groups of photodiodes formed in a semiconductor substrate, each group representing a 2×2 array of photodiodes, with a first group of two photodiodes configured to detect light of a first wavelength and a second group of two photodiodes configured to detect light of a second wavelength, each photodiode of the first group of two photodiodes is positioned adjacent to each photodiode of the second group of two photodiodes; and
a second layer overlapping the first layer, the second layer is organic, having a plurality of organic photodiodes configured to detect light of a third wavelength, each organic photodiode is positioned to partially overlap the first group of two photodiodes and the second group of two photodiodes of the first layer.

2. The image sensor of claim 1, wherein the area of overlap of each of the partially overlapped first group of two photodiodes and second group of two photodiodes is substantially the same.

3. The image sensor of claim 1, further including a circuit part configured to read the detected light from the first group of two photodiodes and the second group of two photodiodes of the first layer, the circuit part positioned relative to the semiconductor substrate for front side illumination.

4. The image sensor of claim 3, wherein the circuit part is positioned between the first layer and the second layer.

5. The image sensor of claim 1, further including a color filter positioned between the first layer and the second layer.

6. The image sensor of claim 1, further including a circuit part configured to read the detected light of the first layer, the circuit part positioned relative to the semiconductor substrate for back side illumination.

7. The image sensor of claim 6, wherein the semiconductor substrate is positioned between the circuit part and the second layer.

8. The image sensor of claim 1, further including a floating diffusion region formed adjacent to each photodiode on the semiconductor substrate, each floating diffusion region is shared by an organic photodiode.

9. The image sensor of claim 1, further including a first readout circuit configured to read the light detected by each photodiode on the semiconductor substrate and a second readout circuit configured to read the light detected by each organic photodiode.

10. The image sensor of claim 1, wherein the light of the third wavelength is green.

11. The image sensor of claim 1, wherein the number of photodiodes in the semiconductor substrate is the same as the number of organic photodiodes in the second layer.

12. An image sensor, comprising:
a first layer having a plurality of first photodiodes and a plurality of second photodiodes formed in a semiconductor substrate, the first photodiodes configured to detect light of a first wavelength and the second photodiodes configured to detect light of a second wavelength, wherein the first photodiodes and the second photodiodes are alternately positioned with each of the first photodiodes positioned adjacent to a second photodiode and vice versa;

a second layer overlapping the first layer, the second layer is organic, having a plurality of organic photodiodes configured to detect light of a third wavelength, wherein the organic photodiodes are skewed with respect to alignment with the first photodiodes and the second photodiodes when viewed perpendicularly to the semiconductor substrate; and a plurality of storage regions formed in the semiconductor substrate, each of the storage regions corresponding to an organic photodiode configured to store electrical charges transmitted through a corresponding metallic contact.

13. The image sensor of claim 12, wherein the skew in alignment between the organic photodiodes and the first and second photodiodes is about 50% in their width and length.

14. The image sensor of claim 12, further including a circuit part configured to read the detected light of the first layer, the circuit part positioned relative to the semiconductor substrate for back side illumination.

15. The image sensor of claim 14, wherein the semiconductor substrate is positioned between the circuit part and the second layer.

16. The image sensor of claim 12, further including a floating diffusion region formed adjacent to each photodiode in the semiconductor substrate, each floating diffusion region is shared by an organic photo diode.

17. The image sensor of claim 12, further including a first readout circuit configured to read the light detected by each photodiode in the semiconductor substrate and a second readout circuit configured to read the light detected by each organic photodiode.

18. The image sensor of claim 12, wherein the light of the third wavelength is green.

19. The image sensor of claim 12, wherein the number of photodiodes in the semiconductor substrate is the same as the number of organic photodiodes in the second layer.

20. A portable electronic device, comprising:
an image sensor configured to generate image data;
a processor configured to process the image data; and
a camera serial interface configured to transmit the image data from the image sensor to the processor,
wherein the image sensor comprising:
a first layer having a plurality of first photodiodes and a plurality of second photodiodes formed in a semiconductor substrate, the first photodiodes configured to detect light of a first wavelength and the second photodiodes configured to detect light of a second wavelength, wherein the first photodiodes and the second photodiodes are alternately positioned with each of the first photodiodes positioned adjacent to a second photodiode and vice versa; and
a second layer overlapping the first layer, the second layer is organic, having a plurality of organic photodiodes configured to detect light of a third wavelength, wherein the organic photodiodes are skewed with respect to alignment with the first photodiodes and the second photodiodes when viewed perpendicularly to the semiconductor substrate.

* * * * *